United States Patent [19]

Yamamoto et al.

[11] Patent Number: 4,827,356

[45] Date of Patent: May 2, 1989

[54] IMAGE RECORDING APPARATUS CAPABLE OF QUICKLY DISCHARGING A RECORDING PAPER

[75] Inventors: Takemi Yamamoto; Yoichi Horaguchi, both of Nagoya, Japan

[73] Assignee: Brother Kogyo Kabushiki Kaisha, Aichi, Japan

[21] Appl. No.: 210,389

[22] Filed: Jun. 23, 1988

[30] Foreign Application Priority Data

Jun. 24, 1987 [JP] Japan .............................. 62-97075[U]

[51] Int. Cl.⁴ ...................... H04N 1/23; G03G 15/00; G01D 15/24
[52] U.S. Cl. .................... 358/302; 358/288; 358/296; 355/309; 346/134
[58] Field of Search ...................... 355/145 H, 35 H; 358/288, 302, 296; 346/134

[56] References Cited

U.S. PATENT DOCUMENTS

| | | | |
|---|---|---|---|
| 4,460,269 | 7/1984 | Yamazaki | 355/145 H |
| 4,497,569 | 2/1985 | Booth | 355/145 H |
| 4,714,943 | 12/1987 | Sakakibara et al. | 355/27 |
| 4,745,435 | 5/1988 | Sakata | 355/145 H |

Primary Examiner—E. A. Goldberg
Assistant Examiner—Scott Rogers
Attorney, Agent, or Firm—Oliff & Berridge

[57] ABSTRACT

When a copying error is noted after a start of copying operation, an error switch is depressed. Upon depression of the error switch, an error signal is applied to a central processing unit which in turn controls a recording sheet transporting means so that the recording sheet is transported at a higher speed.

4 Claims, 2 Drawing Sheets

IMAGE RECORDING APPARATUS CAPABLE OF QUICKLY DISCHARGING A RECORDING PAPER

BACKGROUND OF THE INVENTION

The present invention relates to an image recording apparatus, and more particularly to such an apparatus capable of quickly discharging a recording paper out of the apparatus when a copying error is noted.

In a conventional image recording apparatus, a recording paper is transported at a constant speed during an image recording process. Even if a copying error is noted after the copying operation has started, the image formation proceeds at the constant speed and an operator has to wait for a certain period of time until completion of the entire image formation.

SUMMARY OF THE INVENTION

In view of the above drawback of the conventional image recording apparatus, it is an object of the present invention to provide an image recording apparatus in which the recording paper transportation speed is increased when a copying error is noted, so that the next copying operation can be started shortly.

The above object can be achieved by an image recording apparatus having a control unit for varying the transportation speed of the recording paper during the image recording process.

When a copying error is noted during the image recording process, e.g. when an operator has noticed that he made a mistake in copying a different original, the control unit is operated to increase the speed at which the paper is discharged, whereby unwanted consumption of wasteful time is reduced.

The above and other objects, features and advantages of the present invention will become more apparent from the following description when taken in conjunction with the accompanying drawings in which a preferred embodiment of the present invention is shown by way of illustrative example.

DETAILED DESCRIPTION OF THE PREFERRED EMBODIMENT

Figure 1:
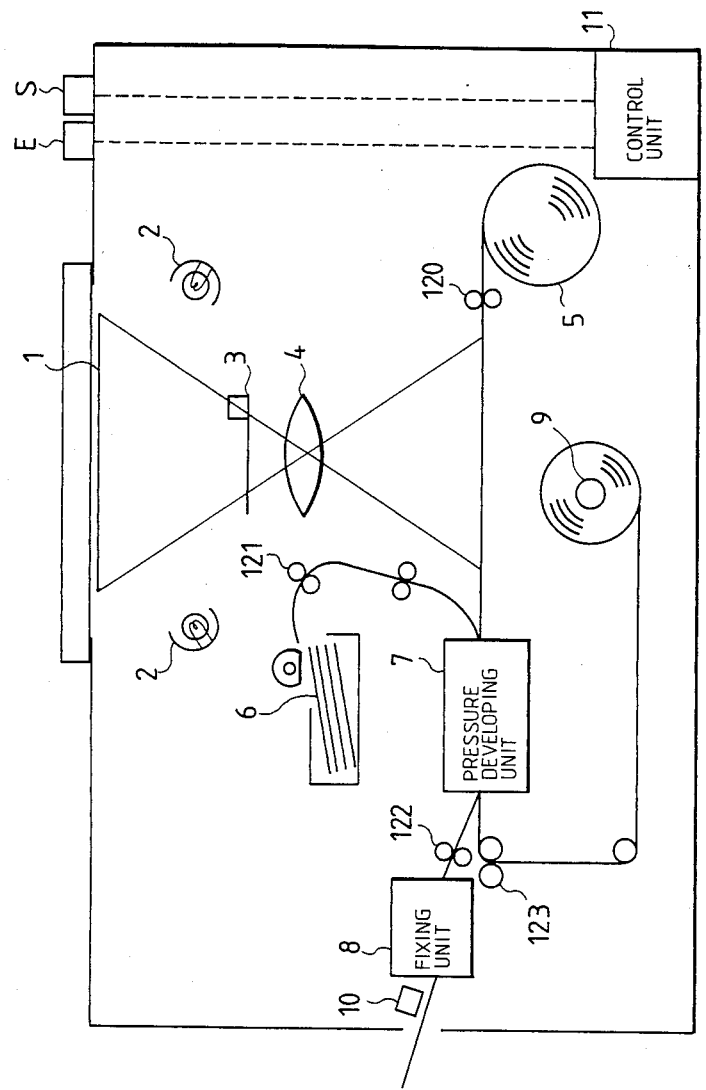
FIG. 1 is a schematic vertical cross-sectional view of an image recording apparatus according to the present invention.

As shown in FIG. 1, an image recording apparatus according to a preferred embodiment of the present invention includes exposure light sources 2 for radiating lights onto an original 1. A shutter 3 is disposed below the original 1 to allow the light reflected from the original 1 to pass therethrough and to interrupt the light to be directed downwardly when the exposure is not taking place. A condenser lens 4 is disposed below the shutter 3 to receive the light reflected from the original 1 when the shutter is in open state. A photosensitive and pressure-sensitive recording sheet 5 in the form of an elongated, continuous sheet is released from a supply roll and is fed into a pressure developing unit 7 while travelling below the condenser lens 4. A developer sheet 6 in the form of a cut sheet is supplied from a sheet storage cassette one by one into the pressure developing unit 7 in timed relation to the exposure by the exposure light sources 2. A thermal fixing unit 8 is provided downstream of the pressure developing unit 7 into which the developer sheet 6 is fed to thermally fix the image thereon. In the output side of the thermal fixing unit 8, a paper end detector 10 is provided which detects the trailing edge of the developer sheet 6 and outputs a paper end signal.

A control unit 11 is provided for controlling the transportation speeds of both the photosensitive and pressure-sensitive recording sheet 5 and the developer sheet 6. The control unit 10 controls the rotational speed of a motor for rotating feed rollers 120, 121, 122 and 123 for feeding those two sheets 5 and 6 and also for rotating a take up roll 9 for winding the recording sheet 5.

A start switch S for starting the copying operation is provided in the upper pannel of the apparatus. The start switch S is connected to the control unit 11 and a copy start signal is fed when the start switch S is depressed. An error switch E connected to the control unit 11 is also provided in the upper pannel of the apparatus. The error switch E is depressed by an operator when a copying error is noted.

In the apparatus described above, it is intended to use a color reproducible medium as disclosed in U.S. Pat. No. 4,399,209 to Sanders et al. The recording medium disclosed therein is of a so-called transfer type which is made up of a photosensitive and pressure-sensitive recording sheet and a developer sheet. The photosensitive and pressure-sensitive recording sheet is made up of a transparent base member made of resin and pressure rupturable microcapsules coated on one surface of the base member, each of the microcapsules separately containing photo-curable resin and one of primary color chromogenic materials or dye precursors, i.e. colors of cyan, magenta and yellow. A latent image is formed on the photosensitive and pressure-sensitive recording sheet, since the microcapsule is sensitive to light in a predetermined wavelength range and a mechanical strength thereof varies when exposed to light. By pressure-rupturing the uncured microcapsules and having the chromogenic material released from the microcapsule react with a developer material coated on the developer sheet, a visible image is formed on the developer sheet. Although the above-described recording sheet is intended to be used in the embodiment of the present invention, photosensitive recording mediums of other kinds may also be employed if applicable to the apparatus described above.

In operation, lights are radiated from the exposure light sources 2 to expose the original 1, and at the same time the shutter 3 is activated to allow the light reflected from the original 1 to enter the condenser lens 4. The light reflected therefrom is applied onto the photosensitive and pressure-sensitive recording sheet 5, whereby a latent image is formed on the recording sheet 5 corresponding to an image on the original 1. Thereafter, the recording sheet 5 enters the pressure developing unit 7 where the developer sheet 6 is superposed on the recording sheet 5 and pressure is applied thereto, whereby the latent image on the recording sheet 5 is developed and transferred onto the developer sheet 6. The developer sheet 6 is then fed into the thermal fixing unit 8 where the developed image on the developer sheet 6 is thermally fixed. Upon leaving the pressure developing unit 7, the recording sheet 5 is separated from the developer sheet 6 and then wound around the takeup roll 9. The developer sheet 6 is discharged outside the apparatus, at which the paper end detector 10 disposed alongside the discharging path detects the trailing edge of the developer sheet 6 and produces the paper end signal.

When a copying error is noted during the image recording process, e.g., while the photosensitive and pressure-sensitive recording sheet 5 is being exposed to the light from the original 1, the error switch E is depressed. In response to the despression of the error switch E, the control unit 11 is operated so as to increase the rotational speed of the motor 14 or to shorten the time required to expose the photosensitive and pressure-sensitive recording sheet 5. The developer sheet 6 is therefore discharged at a high speed from the image recording apparatus. Accordingly, upon an image recording error or failure, the image recording process can be speeded up for increased image recording efficiency.

Alternatively, when an error occurs during an image recording process, the remaining portion of the image recording process subsequent to the error may be skipped, and the developer sheet may be discharged at an increased speed.

Figure 2:
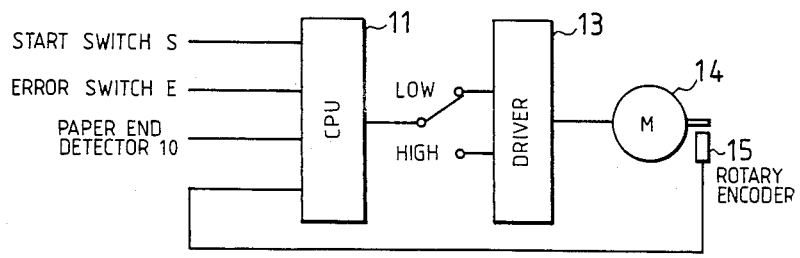
FIG. 2 is a block diagram showing a control unit for controlling a transportation speed of a recording paper.
Figure 3:
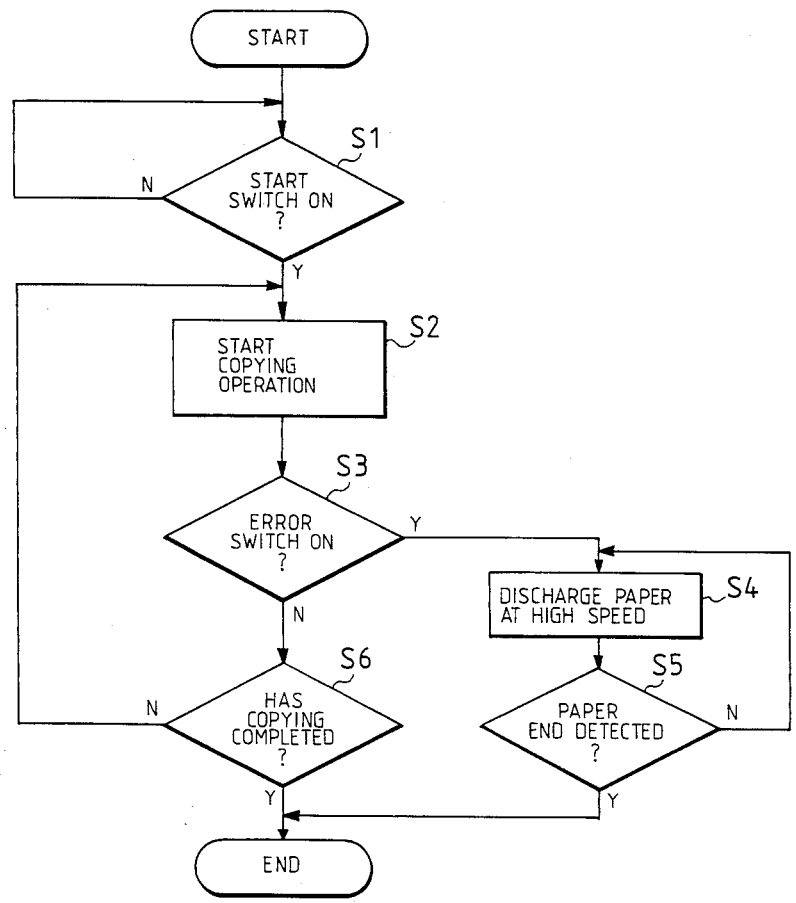
FIG. 3 is a flowchart for description of an operational sequence executed by the control unit shown in FIG. 2.

As shown in FIG. 2, the control unit 11 is constituted with a central processing unit (CPU) 11 which receives in its inputs outputs of the start switch S, the error switch E, and the paper end detector 10. When CPU 11 receives the output of the error switch E, the motor is rotated at a high speed to thereby transport the recording sheet 5 and the developer sheet 6 at a high speed until the developer sheet 6 is discharged. The operational sequences executed by CPU 11 will be described with reference to the flowchart shown in FIG. 3.

Upon receipt of the output of the start switch S (step 1), CPU 11 instructs the apparatus to start the copying operation (step 2). After the start of the copying operation, CPU 11 judges whether or not the error switch E is depressed. When affirmative, CPU 11 applies to a driver 13 a signal for changing the rotational speed of the motor 14 from a low-speed to a high-speed (step 4). The motor 14 is rotated at a high speed unitl CPU 11 receives the output of the paper end detector (step 5). When the error switch E is not depressed and the output of the error switch E is not received in CPU 11, the motor is rotated at the low-speed until completion of the copying operation (step 6).

A rotary encoder 15 is provided in a shaft of the motor 14 for detecting the rotational speed of the motor 14. The detected rotational speed of the motor 14 is fed back to CPU 11 to maintain the rotational speed of the motor 14 at a constant speed.

Although a certain preferred embodiment has been shown and described, it should be understood that the present invention is not limited thereto but a variety of changes and modifications may be made without departing from the scope and spirit of the invention.

What is claimed is:

1. An image recording apparatus for recording an image on an image recording medium, comprising:
    means for instructing a start of a recording operation;
    means for recording an image on said image recording medium, said recording means carrying out the recording operation when said start instructing means is actuated;
    means for instructing an error in actuating said start instructing means and outputting an error signal;
    means for transporting said image recording medium, said image recording medium being transported to a discharge port from which said recording medium is discharged outside the image recording apparatus;
    means for driving said transporting means, said driving means driving said transporting means to move at a first speed during the recording operation; and
    means responsive to said error signal for controlling said driving means so that said driving means drives said transporting means at a second speed higher than said first speed.

2. An image recording apparatus as recited in claim 1, further comprising means for detecting said recording means being discharged outside the image recording apparatus and producing a discharge-indicating signal, and wherein said controlling means controls said driving means so that said driving means stops driving said transporting means in response to said discharge-indicating signal.

3. An image recording apparatus as recited in claim 2, wherein said detecting means comprises a paper end detector disposed in the vicinity of the discharge port.

4. An image recording apparatus as recited in claim 1, wherein said recording medium is a photosensitive and pressure-sensitive recording medium and wherein said recording means comprises an exposure means for exposing said photosensitive and pressure-sensitive recording medium to a light to form a latent image thereon, and a pressure developing means for pressure developing said latent image to provide a visible image.

* * * * *